United States Patent
Desai et al.

(10) Patent No.: US 6,251,766 B1
(45) Date of Patent: Jun. 26, 2001

(54) METHOD FOR IMPROVING ATTACHMENT RELIABILITY OF SEMICONDUCTOR CHIPS AND MODULES

(75) Inventors: Kishor V. Desai, Vestal; Amit K. Sarkhel, Endicott, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/388,755

(22) Filed: Sep. 2, 1999

Related U.S. Application Data

(62) Division of application No. 08/815,238, filed on Mar. 12, 1997, now Pat. No. 6,002,172.

(51) Int. Cl.⁷ ............................ H01L 21/44; H01L 23/48; H01L 23/52; H01L 29/40
(52) U.S. Cl. ............................ 438/614; 438/612; 257/779
(58) Field of Search ..................................... 438/612, 614, 438/615, 616; 257/779

(56) References Cited

U.S. PATENT DOCUMENTS

| | | |
|---|---|---|
| 3,781,596 | 12/1973 | Galli et al. . |
| 3,839,727 | 10/1974 | Herdzik et al. . |
| 4,180,104 | 12/1979 | Park et al. . |
| 4,195,669 | 4/1980 | Ives et al. . |
| 4,268,849 | 5/1981 | Gray et al. . |
| 4,360,142 | 11/1982 | Carpenter et al. . |
| 4,434,434 | 2/1984 | Bhattacharya et al. . |
| 5,027,188 | 6/1991 | Owada et al. . |
| 5,046,161 | 9/1991 | Takada . |
| 5,048,179 | 9/1991 | Shindo et al. . |
| 5,268,072 | 12/1993 | Agarwala et al. . |
| 5,376,584 | 12/1994 | Agarwala . |
| 5,384,283 | 1/1995 | Gegenwarth et al. . |
| 5,451,722 | 9/1995 | Gregoire . |
| 5,523,920 | 6/1996 | Machuga et al. . |
| 5,600,180 | 2/1997 | Kusaka et al. . |

FOREIGN PATENT DOCUMENTS

| | | |
|---|---|---|
| 59-87848 | 5/1984 | (JP) . |
| 63-175445 | 7/1988 | (JP) . |
| 10-135613 | 5/1998 | (JP) . |

*Primary Examiner*—Charles Bowers
*Assistant Examiner*—Nema Berezny
(74) *Attorney, Agent, or Firm*—Ratner & Prestia; Lawrence R. Fraley, Esq.

(57) ABSTRACT

An adhesion pad for adhering a semiconductor chip or a ball grid array module to a supporting substrate includes a stepped or tapered structure. The structure is composed of at least one solder wettable metal or alloy layer having solder deposited thereon. The stepped or tapered structure prevents a fatigue crack from propagating in the X-Y plane above the adhesion pad.

6 Claims, 7 Drawing Sheets

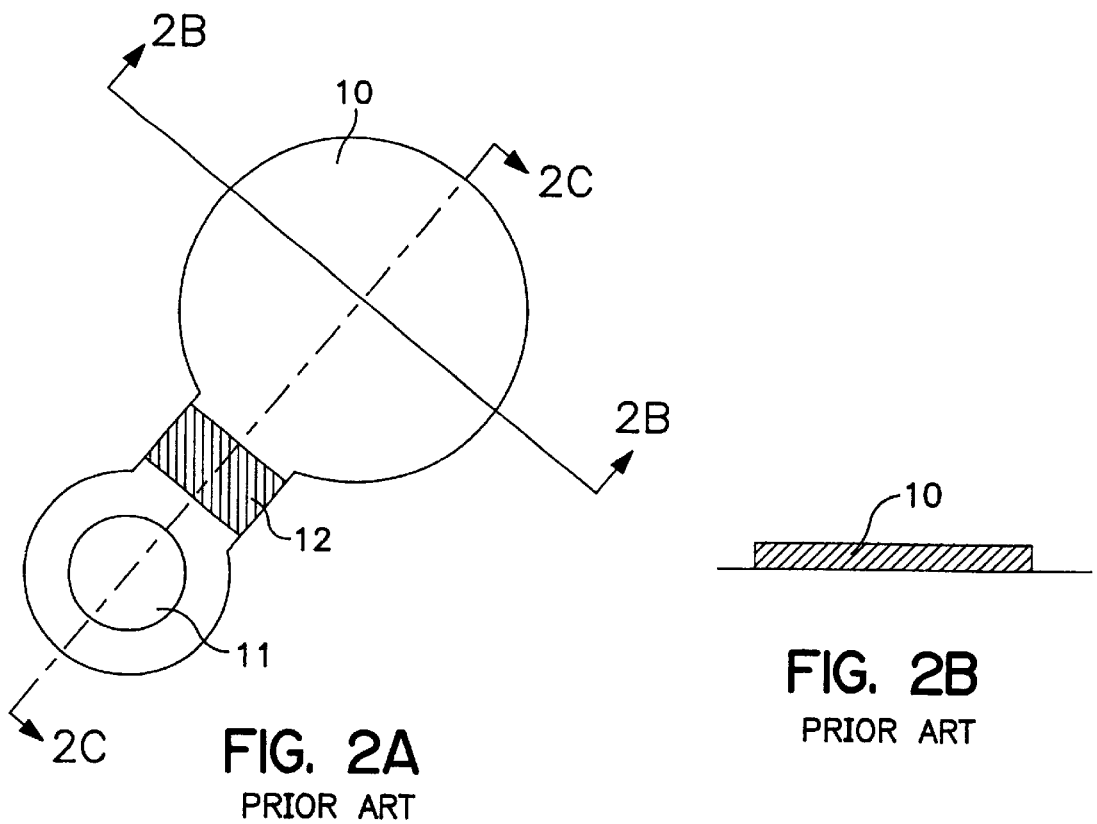
FIG. 2A
PRIOR ART
FIG. 2B
PRIOR ART
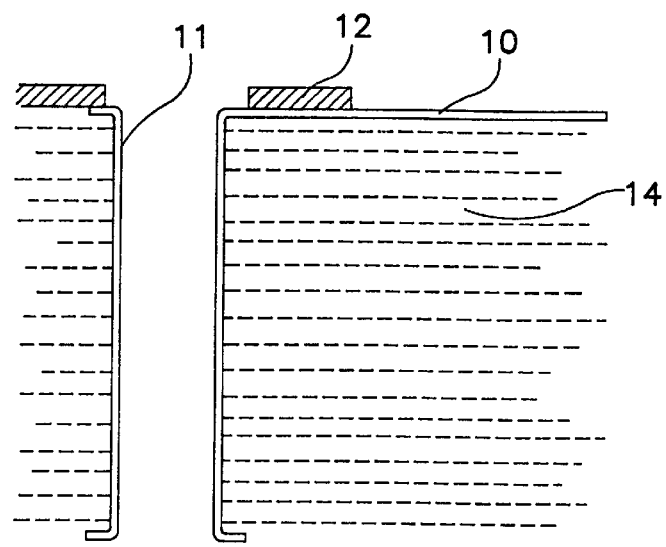
FIG. 2C
PRIOR ART

METHOD FOR IMPROVING ATTACHMENT RELIABILITY OF SEMICONDUCTOR CHIPS AND MODULES

This application is a divisional of U.S. patent application Ser. No. 08/815,238, filed on Mar. 12, 1997, now U.S. Pat. No. 6,002,172 issued Dec. 14, 1999.

FIELD OF THE INVENTION

The present invention relates in general to a method and structure for adhering a semiconductor chip to a supporting substrate. In particular, the present invention describes a method and structure for improving the integrity of ball grid array (BGA) modules and flip chips mounted on printed circuit boards and chip carriers.

BACKGROUND OF THE INVENTION

Solder ball connections have been proven very successful for electrically connecting a semiconductor chip to a supporting substrate. Because a substrate surface is solder non-wettable, a solder ball, typically made of Pb/Sn (lead/tin) solder, does not bond to the substrate surface directly. Hence, an intermediate pad structure is preferably used between the two surfaces to facilitate adhesion. U.S. Pat. No. 5,027,188 issued to Owada et al. shows a semiconductor integrated circuit device and, more particularly, a technique which is useful when applied to a semiconductor integrated circuit device of a so-called "flip-chip" system in which a semiconductor chip is mounted to a substrate through solder bumps.

More specifically, area array packages or ball grid array (BGA) modules, including such modules as ceramic ball grid array (CBGA) modules and tape ball grid array (TBGA) modules, typically have 90/10 weight percent Pb/Sn solder balls on the underside of the package. These solder balls are connected to adhesion pads, typically copper (Cu) pads, residing on a printed circuit board (PCB) by reflowing 63/37 Pb/Sn eutectic solder paste.

FIG. 1 shows an adhesion pad 15 interposed between a supporting substrate 5, such as a printed circuit board (PCB), and a solder ball 25 of, for example, a Pb/Sn alloy. A eutectic solder 20, for example, Pb/Sn, is reflowed to join the solder ball 25 to the adhesion pad 15.

FIGS. 2A–2C show additional views of the prior art. FIG. 2A shows a prior art PCB footprint for BGA packages, with a flat Cu joining or adhesion pad 10. The pad 10 has an associated via 11, connected to the pad 10 through a dogbone, which is covered with solder mask dam 12. Solder mask dam 12 prevents eutectic solder from entering into the via 11 when the BGA package is attached to the PCB.

FIG. 2B shows a cross-section 2B—2B through the adhesion pad 10 of FIG. 2A. A typical thickness of PCB adhesion pad 10 is 38–64 $\mu$m (0.0015–0.0025 inches) with a width or diameter of 610–762 $\mu$m (0.024–0.030 inches). FIG. 2C shows a cross-section 2C—2C through the joining pad 10 and via 11 of FIG. 2A mounted on a circuit board 14.

CBGA modules are typically the least reliable of all BGA modules. Reliability issues limit the size of CBGA modules to about 32 mm (1.26 inches). Prior art reliability enhancements reside on the module side of the assembly as opposed to the board side. Possible alternatives to improving reliability involve the use of a ceramic column grid array (CCGA), TBGA, or plastic BGA (PBGA) module; each of these modules has its own drawbacks. CCGA modules are susceptible to damage and have a high profile, TBGA modules have still not been established in the industry, and PBGA modules are moisture sensitive.

For ball grid array packages, the package-to-circuit board second level attachment reliability is limited by thermal fatigue which causes a crack to be initiated and propagated at the circuit board side of the solder joint, ultimately leading to complete fracture and an electrical open.

Reliability testing by accelerated thermal cycles (ATC) and mechanical deflection stress (MDS) shows that the module-to-PCB solder joints ultimately fail by a crack growth mechanism, as shown in FIG. 3. FIG. 3 shows a typical BGA 30-to-PCB 32 solder joint, similar to that shown in FIG. 1, after the solder joint has failed due to thermal fatigue. Fatigue crack 34 is observed to have traversed through the solder joint in the X-Y plane. Failure occurs at the supporting substrate side (the PCB 32 side) of the solder joints. The crack 34 is initiated just above the Cu pad 33, close to the Cu-Sn intermetallic layer, and the crack 34 then propagates in the X-Y plane, eventually separating the solder joint from the pad 33 and resulting in an electrical open. The crack 34 grows in the X-Y plane because the strain resulting from the differential expansion (and contraction) of the BGA module 30 and PCB 32 is largest in the X-Y plane. In other words, the crack 34 grows in a plane parallel to the Cu pad 33. Also, the crack lies close to the intermetallic layer.

The crack does not propagate in the vertical or Z-direction because the strain is relatively small in that direction. The length of time (or the number of thermal cycles) needed for the crack to grow and cause separation of the joint is inversely proportional to the magnitude of the strain and directly proportional to the area (or diameter) of the PCB pad.

The limited thermal fatigue life of CBGA and TBGA packages, in particular CBGA packages, has restricted their range of application. It has also restricted the size of the area array and the number of functional input/outputs (I/O's) because the magnitude of the maximum strain increases proportionally with the body size. The maxima in strain occur at the corner joints, because strain is proportional to the distance from the neutral point (DNP). Increasing array size means that the DNP of the corner joints increases and causes them to fail sooner than for a smaller size module.

In particular, due to the gross mismatch of the coefficient of thermal expansion (CTE) of a ceramic body compared to a PCB, the CBGA package has only moderate reliability. Although the CBGA package is otherwise robust and possesses many advantages, its limited second level attachment reliability restricts its range of application. If attachment reliability is improved, the range of application would be expanded and also the number of useable I/O's and the size of the package could be increased from the present maximum size of 32 mm (1.26 inches). For the TBGA package, if the attachment reliability is improved, then either the body size could be increased or the pitch of the array could be decreased by providing a smaller PCB pad. In both of these cases, the number of I/O's would increase.

A prior structure used to bond a chip to a PCB includes grooves being formed in the top of the PCB, then metallizing with metal pad sidewall angles of 45 degrees. Another process forms a stepped Cu/Sn pad by subtractive etching around a Pb/Sn solder that is used as a mask, such that a step is formed around the pad. Another process uses a plurality of cavities formed in a plastic chip holder, with the cavities being metallized with chromium/copper (Cr/Cu). Another process includes forming a cavity in a substrate and then creating a stepped pad formation using composite metal sidewalls at angles of 45 degrees. The prior art is directed to reducing edge stress, however, and not to the reduction of crack propagation in the X-Y direction.

Although the art of semiconductor chip to supporting substrate connections is well developed, there remain some problems inherent in this technology. One particular problem is the formation of a crack at the circuit board side of the solder joint caused by thermal fatigue. Therefore, a need exists for a method and structure for increasing the reliability of the connection between an area array package and a supporting substrate.

SUMMARY OF THE INVENTION

The present invention provides a method and structure for increasing the reliability of the connection between an area array package and a supporting substrate by altering the propagation direction of a crack that resides above an intermediate adhesion or joining pad structure.

In the present invention, a step or slope is incorporated into the intermediate pad structure. Because BGA failures occur by a crack being initiated just above the copper pad, close to the Cu—Sn intermetallic layer, and propagating in the X-Y plane, the step forces the crack to move in the Z-direction, thereby slowing down the propagation and increasing the reliability.

The present invention provides an adhesion pad having a first layer formed on a substrate and a second layer formed over the first layer within the perimeter of the first layer to form a raised structure, such as a step structure. A mass of solder is deposited over the raised structure. The first layer and the second layer each preferably comprise at least one of copper, cobalt, nickel, platinum, palladium, and alloys thereof. The solder preferably comprises lead and tin.

Additional embodiments within the scope of this invention include the use of a tapered structure, an etched structure, and a recessed or cavity structure.

The foregoing and other aspects of the present invention will become apparent from the following detailed description of the invention when considered in conjunction with the accompanying drawings.

BRIEF DESCRIPTION OF THE DRAWINGS

FIG. 2A is a top view of a conventional printed circuit board (PCB) footprint for BGA packages;

FIG. 2B shows a cross-section of the PCB footprint of FIG. 2A;

FIG. 2C shows a further cross-section of the PCB footprint of FIG. 2A;

DESCRIPTION OF EXEMPLARY EMBODIMENTS AND BEST MODE

The present invention is directed to adhesion pads formed on a supporting substrate and to their method of fabrication. The present invention is used to join semiconductor chips, such as ball grid array (BGA) modules and flip chips, to a substrate, such as a printed circuit board (PCB), a microelectronic circuit card, or any organic or ceramic chip carrier or organic circuit board. A step or taper is incorporated into the pad to prevent or delay crack propagation in the X-Y plane to improve thermal fatigue life, thereby increasing reliability. Because the thermal fatigue crack grows in the X-Y plane, a structure that prevents its growth in the X-Y plane and induces the crack to move in the vertical direction (the Z-plane) increases the fatigue life of the device.

Figure 1:
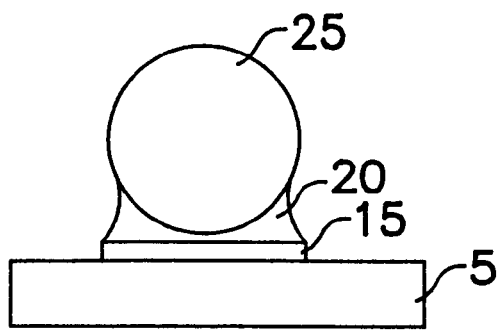
FIG. 1 is a side view of a conventional solder ball mounted to a supporting substrate.
Figure 3:
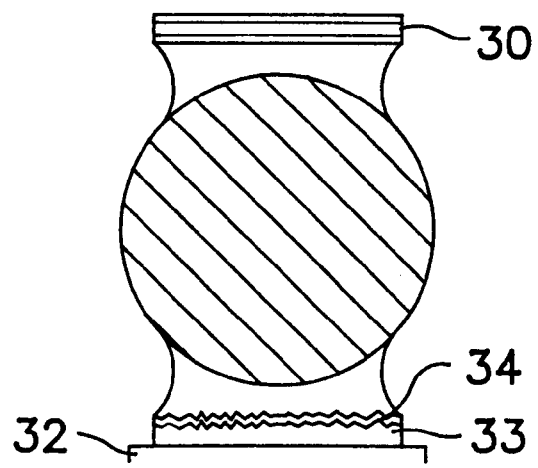
FIG. 3 is side view of a failed conventional bond.
Figure 4A:
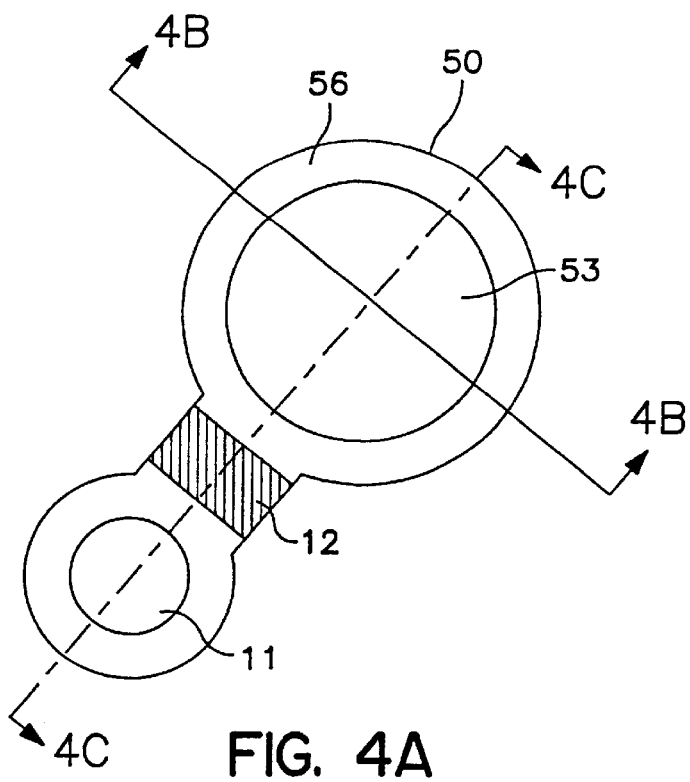
FIG. 4A is a top view of a PCB footprint for BGA packages in accordance with the present invention.
Figure 4B:
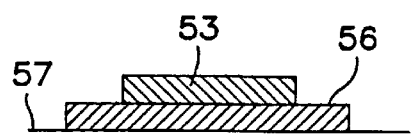
FIG. 4B shows a cross-section of the PCB footprint of FIG. 4A.
Figure 4C:
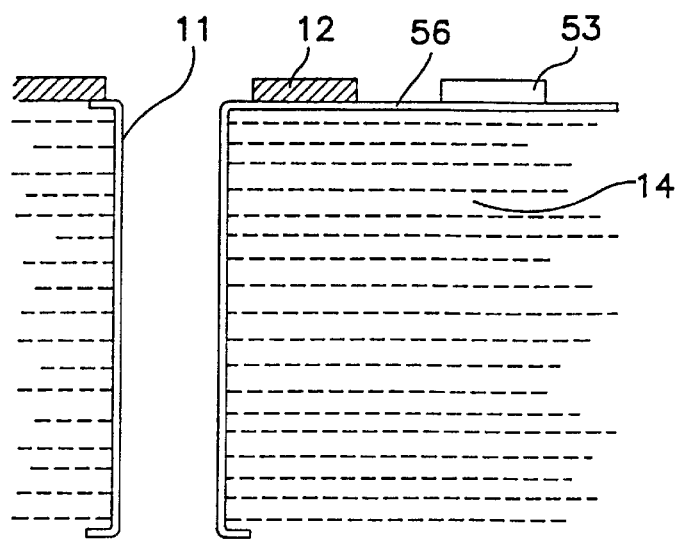
FIG. 4C shows a further cross-section of the PCB footprint of FIG. 4A.

An exemplary structure in accordance with the present invention is shown in FIGS. 4A–4C. FIGS. 4A–4C contain elements similar to those described above with respect to FIGS. 2A–2C. These elements are labeled identically and their description is omitted for brevity.

FIG. 4A shows a top view of a stepped pad 50 of the present invention. The pad is preferably copper (Cu), but may be cobalt (Co), nickel (Ni), platinum (Pt), palladium (Pd), or any other metal or alloy which is wettable by molten solder. The stepped Cu pad 50 consists of a step pad 53 formed over a base pad 56. The base pad 56 is substantially identical to the prior art pad 10 as shown in FIG. 2A. From the exemplary top view, the step pad 53 has a substantially circular shape that is concentric with the substantially circular shaped base pad 56. It should be noted that the pads can be other shapes including, but not limited to, rectangles and off-center circles, as described, below with respect to FIGS. 5–9. Both pads 53 and 56 are formed by conventional techniques such as plating or vacuum evaporation. Both pads can be formed together or separately and can be formed of the same material or different materials.

FIG. 4B shows a cross-section of FIG. 4A through line 4B—4B. Step 53 has a preferred diameter of 381–457 $\mu$m (0.015–0.018 inches) and a preferred thickness of 63–76 $\mu$m (0.0025–0.0030 inches). The base pad 56 is substantially similar to the prior art pad 10 of FIG. 2A and has a preferred diameter in the range of 609–762 $\mu$m (0.024–0.030 inches) and a preferred thickness of 33–41 $\mu$m (0.0013–0.0016 inches). Generally, PCB footprint designs vary somewhat for CBGA and TBGA modules. For example, for a TBGA module, the base pad is preferably about 635 $\mu$m (0.025 inches) in diameter and, for a CBGA module, the base pad is preferably about 724 µm (0.0285 inches) in diameter. The step pad 53 has a diameter that is about 60–70% of the diameter of the base pad 56. The base pad 56 is formed on the substrate surface 57.

The exemplary base pad 56 of the present invention is slightly thinner (33–41 µm or 0.0013–0.0016 inches) than the prior art pad 10. The prior art pad 10 allows a somewhat wider range of thicknesses (38–51 µm or 0.0015–0.0020 inches) because the thickness or height is not very important. In the exemplary pad structure of the present invention, the base pad 56 is preferably a few tenths of a mil thinner in order to keep the total height (base pad height+ step height) of the joining pads in the range of (101–115 µm or 0.0040–0.0045 inches). Moreover, it is preferable that the height of the step pad 53 is at least 10% of the diameter of the base pad 56.

Before joining a BGA module to a PCB, solder paste is stenciled onto the PCB pads. Stencils for BGAs are typically 152–203 µm (0.006–0.008 inches) thick and have apertures of about 762 µm (0.030 inches) in diameter. Therefore, the step does not cause any problems with respect to registration of the stencil aperture to the pad. The step pad 53 having a diameter of 381–457 µm (0.015–0.018 inches) easily fits within a stencil aperture of 762 µm (0.030 inches) size.

FIG. 4C shows a cross section through the stepped pad 50 and via 11 of FIG. 4A through line 4C—4C. As described above, the height of the step 53 is preferably in the range of 63–76 µm (0.0025–0.0030 inches). For this exemplary structure, solder mask dam 12 is desirably at least equal to the step height. The solder mask dam 12 of the present pad structure is thicker than the conventional pad structure because step pad 53 is preferably recessed in the solder mask coating as much as possible in order to physically protect the step pad 53 against scratching and other damage. Such thicker solder d are created by a dry film solder mask.

One method of fabricating the stepped pad structure is to process the panel in the conventional manner through the processing step of creating the base pad. Following this, resist is applied and patterned in the conventional manner to create openings for the step pad(s). The step pads are then fabricated using conventional plating or vacuum evaporation.

Figure 5A:
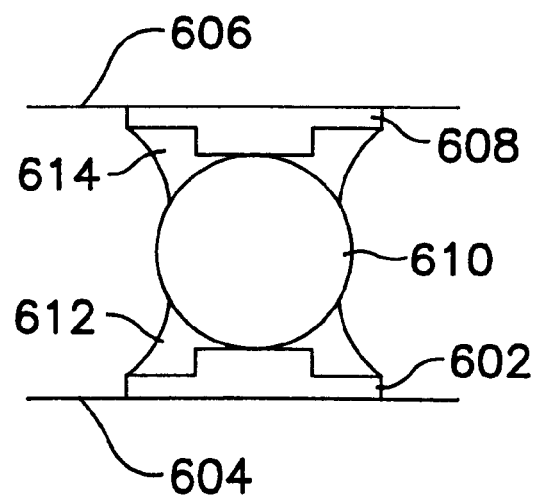
FIG. 5A shows a side view of a solder ball and BGA mounted on the adhesion pad of FIG. 4B.

FIG. 5A shows the exemplary stepped adhesion pad of FIG. 4B used as a mounting pad for a BGA module. In this exemplary embodiment, the stepped pad 602, preferably Cu, is formed on the surface of a PCB 604. The surface of a BGA module 606 has a pad 608 which is used for mounting. In this exemplary embodiment, the pad 608 has desired diameter of 89 µm (0.0035 inches) and is Ni plated, but any conventional pad size and material can be used. A solder ball 610, preferably a high lead solder such as 95/5 or 90/10 Pb/Sn having a diameter of 89 µm (0.0035 inches), is mounted between eutectic solder 612, preferably Pb/Sn, and the two pads 602 and 608. A solder joint is formed when the solder is reflowed (melted).

More specifically, a low melting point (LMP) solder 612 and 614 is applied to both bonding pads 602 and 608, respectively. A high melting point (HMP) solder ball 610 is placed in contact with the LMP solder 612 and 614, and the assembly is heated to reflow the LMP solder 612 and 614, which then wets to the non-molten HMP solder ball 610.

The terms "low melting point" and "high melting point" are not terms having specific temperatures associated with them. The requirement for the subject invention is that the solder 612 and 614 which is applied to the bonding pad have a lower melting point than that of the HMP solder ball 610. Examples of materials which are suitable include a eutectic solder of 37/63 weight percent Pb/Sn for the LMP material and a non-eutectic solder composition of 90/10 weight percent Pb/Sn for the HMP material. There are a wide range of materials which would be suitable for the subject invention, however, many of which are recited throughout the art with reference to solder connections.

It is possible to apply (screen) the LMP solder paste to the HMP ball and then bring the bonding surface (pad) into contact with the LMP solder, thereby causing the LMP solder paste and HMP ball to become attached to the bonding pad. An alternative method is to screen the LMP solder in the form of a paste onto the bonding pad and then bring the HIP ball and LMP solder into contact. The order of application steps is not critical to the invention.

In accordance with the subject invention, the BGA module 606 with pad 608, LMP solder 614 and HIP ball 610 is brought into contact with PCB 604 having pad 602 and LMP solder 612, and the two are heated to a temperature sufficient to reflow the LMP solder 612 and 614 but not sufficient to melt the HMP solder ball 610. The LMP solder which is attached to the bonding pad 608 on BGA 606 will wet the HMP ball 610 and connection will be achieved.

It should be noted, and evident to those having skill in the art, that the low melting point solder which is associated with the PCB 604 may be applied directly to the bonding pad 602 or may be applied to the HMP ball 610, at the outer connection surface, before joining the BGA/ball assembly to the PCB. The LMP solder 612 can be applied to the HMP ball 610 as an additional portion of the BGA assembly, which would then consist of the BGA 606, LMP solder 614, HMP solder ball 610, and LMP solder 612. If the latter method is chosen, the assembled part may then be brought into contact with the PCB 604, having only a wettable stepped pad 602 at its surface, and the BGA assembly and the PCB heated, as above, to a temperature sufficient to reflow the LMP solder which is located on the BGA and is in contact with the bonding pad on the PCB. The LMP solder 612 used at the ball-to-PCB interface can be a third solder composition or the same LMP solder as the LMP solder 614 used at the BGA-to-ball interface. The above described reflow materials and technique are applicable to all the embodiments of the present invention.

Figure 5B:
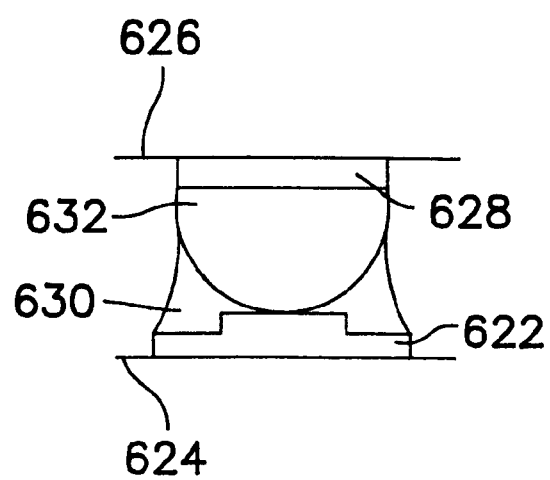
FIG. 5B shows a side view of a flip chip mounted on the adhesion pad of FIG. 4B.

FIG. 5B shows the exemplary stepped adhesion pad of FIG. 4B used as a mounting pad for a flip chip. In this exemplary embodiment, the stepped pad 622 is formed on the surface of a chip carrier 624. The surface of a flip chip 626 has a pad 628 which is used for mounting a solder bump 632, which is preferably made of a HMP solder such as 95/5 Pb/Sn. A eutectic 630, preferably 37/63 Pb/Sn, is placed on the stepped pad 622. A joint is formed when the eutectic 630 is reflowed.

Figure 6A:
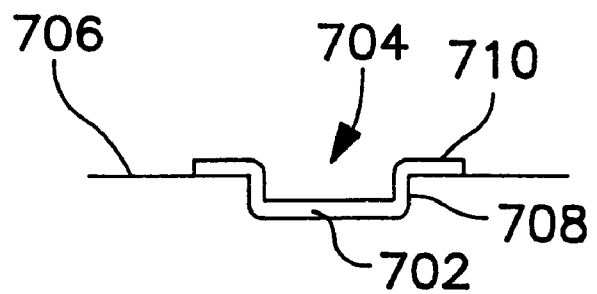
FIG. 6A shows a side view of a further exemplary adhesion pad in accordance with the present invention.

FIG. 6A shows a side view of a further exemplary adhesion pad in accordance with the present invention. In FIG. 6A, a layer of material 702, preferably plated Cu, is formed on the walls and bottom of a recess or cavity 704 in a substrate 706. The step formed by the cavity walls 708 results in stepped adhesion pads 710 on the sides of the cavity 704. The cavity 704 is fabricated by conventional masking technology, in which a photoresist is applied, patterned, exposed, and developed. Preferably, the depth of the cavity is larger than the thickness of the pad and the depth of the cavity is smaller than the diameter of the cavity. More preferably, the diameter of the cavity is 40–100% of the diameter of the pad.

Figure 6B:
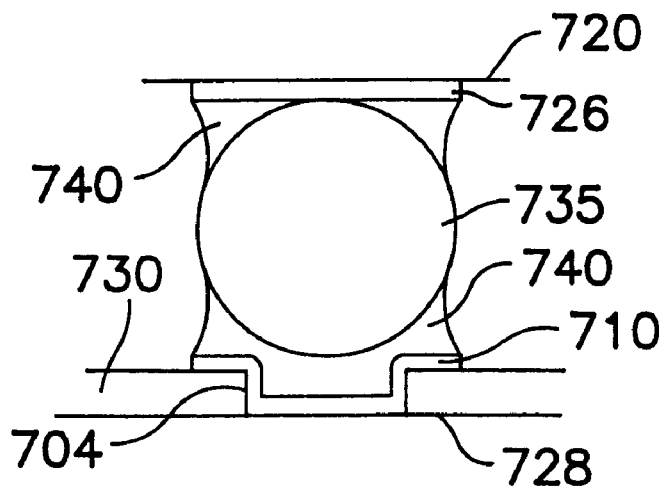
FIG. 6B shows a side view of a solder ball mounted on the adhesion pad of FIG. 6A.

FIG. 6B shows a side view of a solder ball of a BGA module mounted on the adhesion pad structure of FIG. 6A. In this exemplary embodiment, stepped pads 710, preferably Cu, are formed from a cavity 704 formed by photoresist 730 patterned on the surface of a PCB 728. The surface of the BGA 720 has a pad 726 which is used for mounting. A solder ball 735, preferably 90/10 Pb/Sn, is mounted between eutectic solder 740, preferably Pb/Sn, and the pads 710 and 726. The eutectic solder 740 is reflowed to form a joint. This structure and technique can also be used to mount other semiconductor chips, such as a flip chip to a supporting substrate.

Figure 7A:
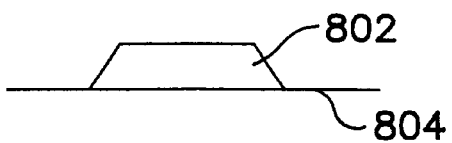
FIG. 7A shows a side view of a further exemplary adhesion pad in accordance with the present invention.

FIG. 7A shows a side view of a further exemplary adhesion pad in accordance with the present invention. In FIG. 7A, the adhesion pad 802, on substrate 804, has tapered sidewalls rather than having a step, as in FIG. 4B. The tapered sidewalls reduce the crack propagation in the X-Y plane, similar to the above described stepped pad, resulting in a more reliable assembly. Preferably the surface of the pad has a diameter that is about 30–70% of the diameter of the bottom of the pad. Preferably, the angle between the sides of the pad and the substrate is at least 30 degrees and, more preferably, about 45 degrees.

Figure 7B:
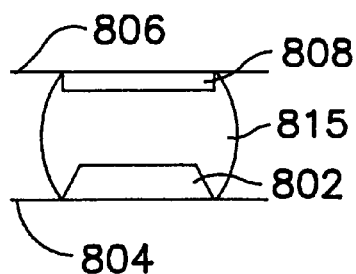
FIG. 7B shows a side view of an exemplary BGA mounted on the adhesion pad of FIG. 7A.

FIG. 7B shows a side view of an exemplary BGA module mounted on the tapered adhesion pad of FIG. 7A. In this exemplary embodiment, the tapered pad 802, preferably Cu, is formed on the surface of a PCB 804. The surface of a BGA 806 has a pad 808 which is used for mounting. Eutectic solder 815, preferably Pb/Sn, is placed between the two pads 802 and 808 and reflowed to form a joint.

Figure 7C:
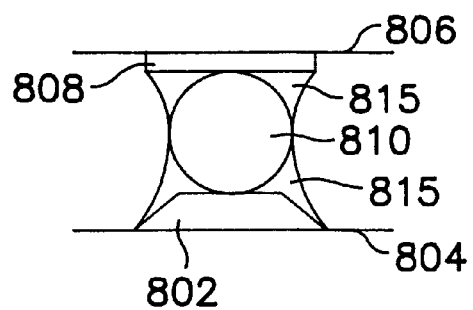
FIG. 7C shows a side view of a solder ball of a further exemplary BGA mounted on the adhesion pad of FIG. 7A.

FIG. 7C shows a side view of a solder ball of a further exemplary BGA module mounted on the adhesion pad of FIG. 7A, similar to FIG. 5A. In this exemplary embodiment, the tapered pad 802 is formed on the surface of a PCB 804. The surface of a BGA 806 has a pad 808 which is used for mounting. A solder ball 810, preferably 90/10 Pb/Sn, is mounted between eutectic solder 815, preferably Pb/Sn, and the two pads 802 and 808. A joint is formed by reflowing the eutectic solder 815.

The above described adhesion pad with tapered sidewalls is fabricated using conventional processing techniques such as plating, vacuum evaporation, and wet or dry etching.

Figure 8A:
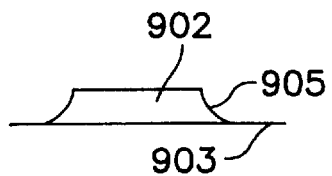
FIG. 8A shows a side view of a further exemplary adhesion pad in accordance with the present invention.

FIG. 8A shows a side view of a further exemplary adhesion pad in accordance with the present invention. In FIG. 8A, the adhesion pad 902 has etched sidewalls 905 rather than a step, as in FIG. 4B, and is formed on a supporting substrate 903. The etched sidewalls 905 are formed during the fabrication process using conventional wet or dry etching techniques. It should be noted that subtractive masked etching methods of forming the etched pad are likely to leave a fillet around the edge of the step.

Figure 8B:
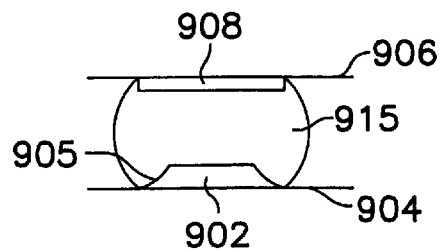
FIG. 8B shows a side view of an exemplary BGA mounted on the adhesion pad of FIG. 8A.

FIG. 8B shows a side view of an exemplary BGA module mounted on the adhesion pad of FIG. 8A. In this exemplary embodiment, the etched pad 902, preferably Cu, is formed on the surface of a PCB 904. The surface of a BGA 906 has a pad 908 which is used for mounting. Eutectic solder 915, preferably Pb/Sn, is placed between the two pads 902 and 908. The solder is reflowed to produce a joint.

Figure 8C:
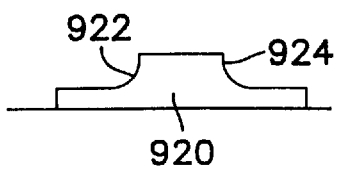
FIG. 8C shows a side view of a further exemplary adhesion pad in accordance with the present invention.

FIG. 8C shows a side view of a further exemplary adhesion pad in accordance with the present invention. In FIG. 8C, the adhesion pad 920 has etched sidewalls 922 combined with a step 924.

Figure 9A:
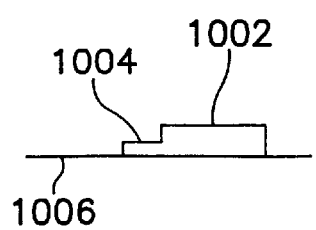
FIG. 9A shows a side view of a further exemplary adhesion pad in accordance with the present invention.
Figure 9B:
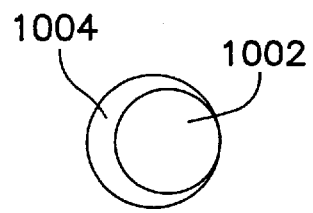
FIG. 9B shows a top view of the exemplary adhesion pad of FIG. 9A.

FIG. 9A shows a side view of a further exemplary adhesion pad in accordance with the present invention. In FIG. 9A, an upper pad 1002 is formed on a lower pad 1004 which is formed on a surface of the supporting substrate 1006. This is similar to FIG. 4B. The upper pad 1002 is not centered on the lower pad 1004, however, as shown in FIG. 9B. The upper pad 1002 is placed to a side of the lower pad 1004. This exemplary pad structure can be used in any of the above described BGA or flip chip attachment structures.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A process for forming an improved solder interconnection on a semiconductor device and supporting substrate comprising:

forming a raised solder wettable pad structure on said supporting substrate by depositing a first layer on said supporting substrate and depositing a second layer over said first layer, said first and second layers are substantially circular, each having a respective diameter, said diameter of said second layer is in the range of 30–70% of said diameter of said first layer, said first layer has a thickness at least 10% of said diameter of said first layer, said thickness of said first layer is in the range of 33–41 μm (0.0013 to 0.0016 inches) and said second layer has a thickness in the range of 63–76 μm (0.0025 to 0.0030 inches);

said substrate is one of the group consisting of an organic chip carrier, a ceramic chip carrier, and an organic circuit board;

depositing a layer of solder over the resultant pad structure;

placing said semiconductor device, provided with a corresponding solder wettable pad, on said supporting substrate; and heating to join said pad on said semiconductor device to said pad structure on said substrate by reflowing said layer of solder.

2. The process according to claim 1, further comprising:

depositing a further layer of solder over said solder wettable pad on said semiconductor device and depositing a solder ball on said further layer of solder, prior to placing said semiconductor device on said supporting substrate.

3. The process according to claim 2, wherein said solder in said layer of solder and said further layer of solder comprises tin and lead, and said first layer is one of a metal and an alloy and said second layer is one of a metal and an alloy, said first layer and said second layer each comprise at least one of the group consisting of copper, cobalt, nickel platinum and palladium.

4. A method of forming a metallic contact on an integrated circuit card, comprising the steps of:

patterning and depositing a first layer on a substrate on said integrated circuit card;

patterning and depositing a second layer on said first layer to form at least one raised structure on said first layer said first and second layers are substantially circular, each having a respective diameter, said diameter of said second layer is in the range of 30–70% of said diameter of said first layer, said first layer has a thickness at least 10% of said diameter of said first layer, said thickness of said first layer is in the range of 33–41 μm (0.0013 to 0.0016 inches) and said second layer has a thickness in the range of 63–76 μm (0.0025 to 0.0030 inches) said substrate is one of the group consisting of an organic chip carrier, a ceramic chip carrier, and an organic circuit board; and depositing solder over said raised structure and a portion of said first layer.

5. The method according to claim 4, wherein said first layer is one of a metal and an alloy and said second layer is one of a metal and an alloy, said first and second layers being solder wettable and each comprise at least one of the group consisting of copper, cobalt, nickel platinum, palladium, and alloys thereof.

6. The method according to claim 4, wherein said first layer and said second layer are patterned and deposited by at least one technique selected from the group consisting of plating, evaporation, and etching.

* * * * *